(12) United States Patent
Huang

(10) Patent No.: US 8,710,544 B2
(45) Date of Patent: Apr. 29, 2014

(54) ISOLATED SCR ESD DEVICE

(75) Inventor: Chih-Feng Huang, Jhubei (TW)

(73) Assignee: Richtek Technology Corporation, Chupei, Hsin-Chu (TW)

( * ) Notice: Subject to any disclaimer, the term of this patent is extended or adjusted under 35 U.S.C. 154(b) by 0 days.

(21) Appl. No.: 13/345,694

(22) Filed: Jan. 7, 2012

(65) Prior Publication Data

US 2012/0104458 A1    May 3, 2012

Related U.S. Application Data

(62) Division of application No. 12/586,455, filed on Sep. 22, 2009, now abandoned.

(30) Foreign Application Priority Data

Jan. 6, 2009 (TW) .............................. 98100204 A

(51) Int. Cl.
*H01L 29/73* (2006.01)

(52) U.S. Cl.
USPC ........... 257/173; 257/343; 257/355; 257/359; 257/E29.181; 257/E23

(58) Field of Classification Search
USPC ......... 257/173, 343, 355–359, E29.181, E23, 257/174, 107, 184
See application file for complete search history.

(56) References Cited

U.S. PATENT DOCUMENTS

2003/0007301 A1 * 1/2003 Ker et al. ...................... 361/111

* cited by examiner

*Primary Examiner* — Cathy N Lam
(74) *Attorney, Agent, or Firm* — Tung & Associates

(57) ABSTRACT

The present invention discloses an isolated SCR ESD device, comprising: a substrate; a first well located in the substrate, which is floating and has a first conductivity type; a first high density doped region located in the first well and having a second conductivity type; a second well nearby the first well and having the second conductivity type; a second high density doped region located in the second well and having the second conductivity type; and a third high density doped region located in the second well and having the first conductivity type, wherein the first high density doped region is for electrical connection with a pad, and wherein the first well is not provided with a high density doped region having the first conductivity type for connection with the pad.

6 Claims, 3 Drawing Sheets

ISOLATED SCR ESD DEVICE

This is a Divisional Application of a application Ser. No. 12/586,455, filed on Sep. 22, 2009 now abandoned.

BACKGROUND OF THE INVENTION

1. Field of Invention

The present invention relates to an isolated silicon controlled rectifier (SCR) electro-static discharge (ESD) device; particularly, it relates to an isolated SCR ESD device which prevents a negative voltage from adversely impacting a circuit.

2. Description of Related Art

ESD devices are used in many integrated circuits to discharge high voltage received by external pins before the high voltage damages internal devices. One type of ESD devices uses an SCR. FIG. 1 shows such a conventional SCR ESD device, which includes: an N-type well 11 and a P-type well 21 located in a P-type substrate 100, a high density P+ doped region 13 and a high density N+ doped region 15 located in the N-type well 11, and a high density P+ doped region 23 and a high density N+ doped region 25 located in the P-type well 21. In this SCR ESD device, the P+ doped region 13, the N+ doped region 15, the N-type well 11, and the P-type well 21 constitute a PNP transistor; the N-type well 11, the P-type well 21, and the N+ doped region 25 constitute an NPN transistor. An external pad PAD is coupled to the P+ doped region 13 and the N+ doped region 15, and, an external grounding pad GND is coupled to the P+ doped region 23 and the N+ doped region 25. Therefore, when the external pad PAD receives a high voltage, the SCR ESD device is triggered to conduct a current to the grounding pad GND.

The abovementioned prior art has the following shortcoming. When the external pad PAD receives a negative voltage, a junction diode formed by the high density N+ doped region 15, the N-type well 11, and the P-type substrate 100 will be forward biased and turned on, resulting in a current loss from the substrate 100 to the external pad PAD. The current loss consumes power, and furthermore it may create a latch-up effect, causing malfunctions of internal circuit devices. In general ESD design, it is not expected that a negative voltage will be applied to the external pad PAD. However, when the circuit is used to drive power transistor switches, a transient negative voltage may be applied to the external pad PAD due to the switching ringing of the power transistor switches.

In view of the foregoing, the present invention provides an isolated SCR ESD device, which can avoid the adverse impact on a circuit caused by a negative voltage.

SUMMARY OF THE INVENTION

An objective of the present invention is to provide an SCR ESD device.

In order to achieve the foregoing objective, according to one perspective of the present invention, it provides an SCR ESD device, comprising: a substrate; a first well located in the substrate, which is floating and has a first conductivity type; a first high density doped region located in the first well and having a second conductivity type; a second well nearby the first well and having the second conductivity type; a second high density doped region located in the second well and having the second conductivity type; and a third high density doped region located in the second well and having the first conductivity type, wherein the first high density doped region is for electrical connection with a pad, and wherein the first well is not provided with a high density doped region having the first conductivity type for connection with the pad.

In the isolated SCR ESD device mentioned above, in one embodiment, a high density doped region is formed at the junction area between the first well and second well. The high density doped region can be the first conductivity type or the second conductivity type. In another embodiment, a high density doped region of the first conductivity type is formed in the first well with a predetermined distance apart from the junction area between the first well and second well. Or in another embodiment, a high density doped region of the second conductivity type is formed in the second well with a predetermined distance apart from the junction area between the first well and second well.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, but not drawn according to actual scale.

Figure 1:
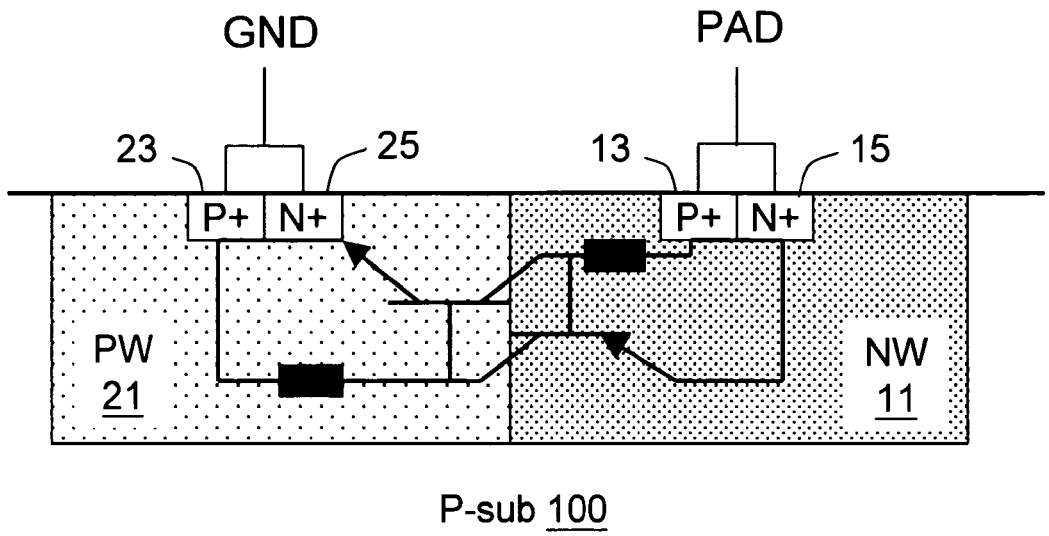
FIG. 1 is a cross-sectioned diagram of a prior art SCR ESD device.
Figure 2:
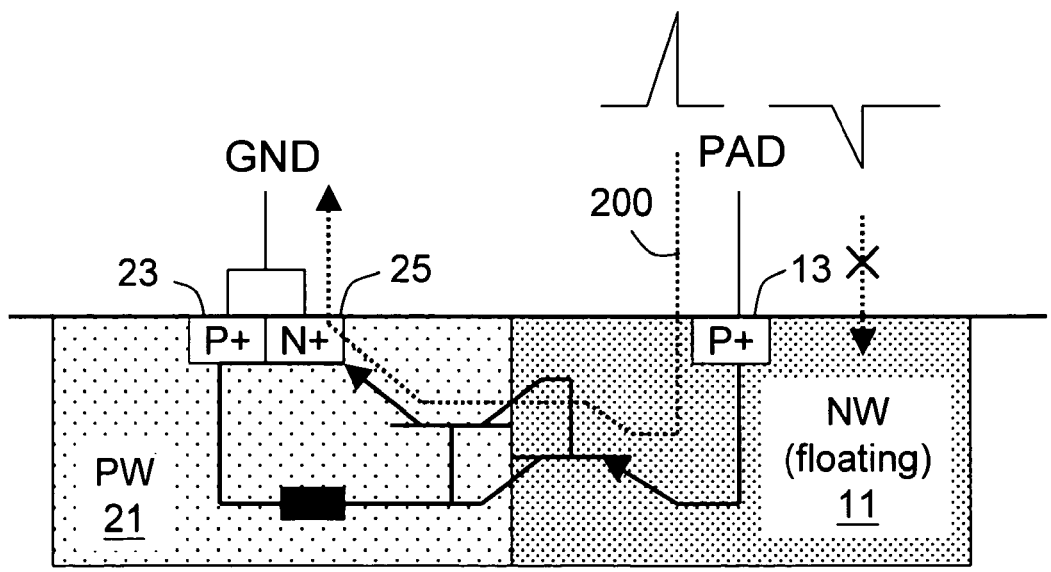
FIG. 2 to FIG. 6 show schematic cross-sectional diagrams of several embodiments of the present invention.

Referring to FIG. 2, it shows the first embodiment of the present invention. In this embodiment, the N-type well 11 is floating; furthermore, only the high density P+ doped region 13 is formed in the N-type well 11 but not the high density N+ doped region (15 in FIG. 1). The external pad PAD is only connected to the P+ doped region 13. When the external pad PAD receives a high voltage, it can be discharged via a path 200 shown in the diagram. Importantly, the present invention is different from the prior art in that, when the external pad PAD receives a negative voltage, the negative voltage does not impact on the circuit due to the PN junction formed by the P+ doped region 13 and the N-type well 11. The problem in the prior art can be solved because the negative voltage can not induce any current loss from the substrate by any path.

Figure 3:
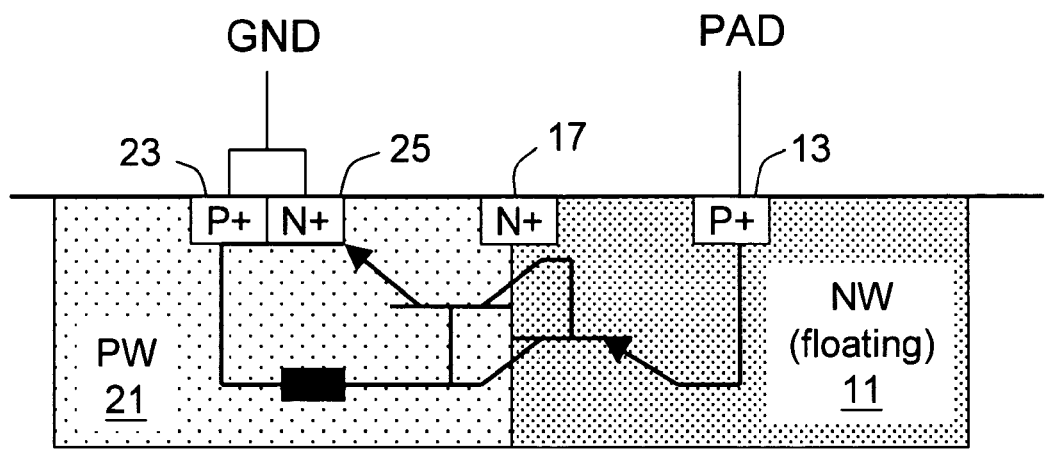

FIG. 3 shows another embodiment of the present invention. In this embodiment, a high density N+ doped region 17 is formed at the junction area between the N-type well 11 and the P-type well 21. The purpose of the N+ doped region 17 is to adjust the trigger voltage of the ESD device. More specifically, the breakdown voltage of the junction diode formed by the N-type well 11 and the P-type well 21 is high, for example, about 40V or so. If the N+ doped region 17 is provided, by means of the junction formed by the N+ doped region 17 and the P-type well 21, the breakdown voltage can be effectively reduced to, e.g., about 12-15V or so; as a result, the SCR can be turned on at a lower voltage to trigger the ESD function.

Figure 4:
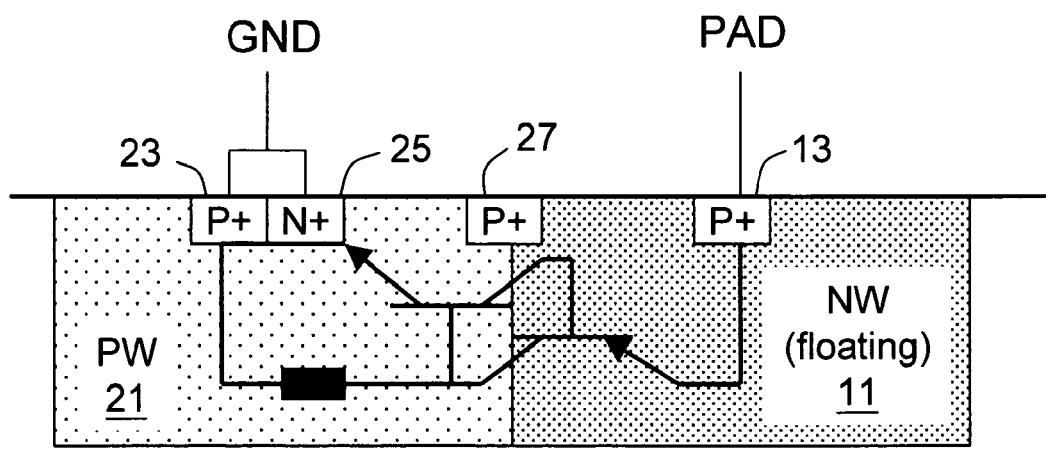

FIG. 4 shows a similar embodiment to FIG. 3. A high density P+ doped region 27 is formed at the junction area between the N-type well 11 and the P-type well 21. The purpose of the P+ doped region 27 is also for adjusting the trigger voltage of the ESD device. The junction formed by the N-type well 11 and P+ doped region 27 can also reduce the breakdown voltage, so as to trigger the ESD function earlier.

Figure 5:
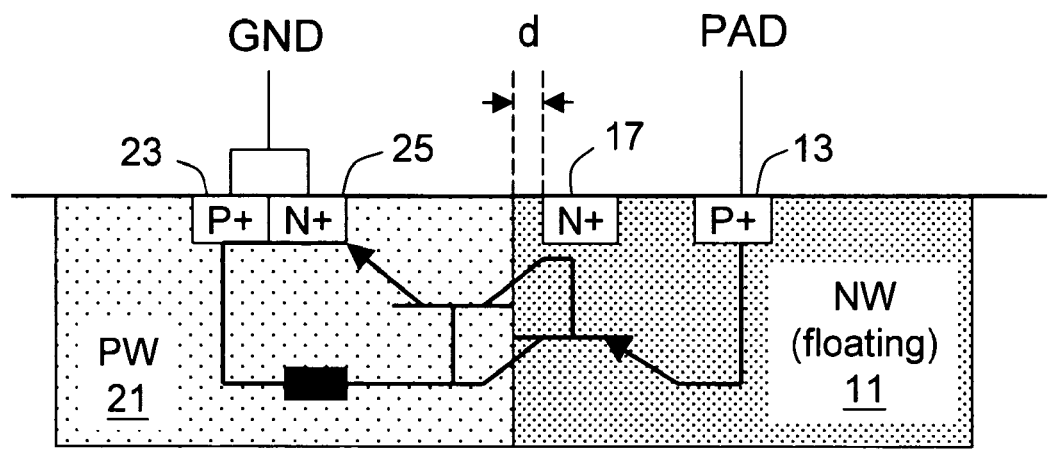

FIG. 5 shows another embodiment of the present invention. In this embodiment, the N+ doped region 17 is not formed at the junction area between the N-type well 11 and P-type well 21, but rather at a predetermined distance d apart from the boundary of the P-type well 21. By adjusting the distance d, the trigger voltage of the ESD device can be adjusted to a range between the embodiments of FIG. 2 and FIG. 3.

Figure 6:
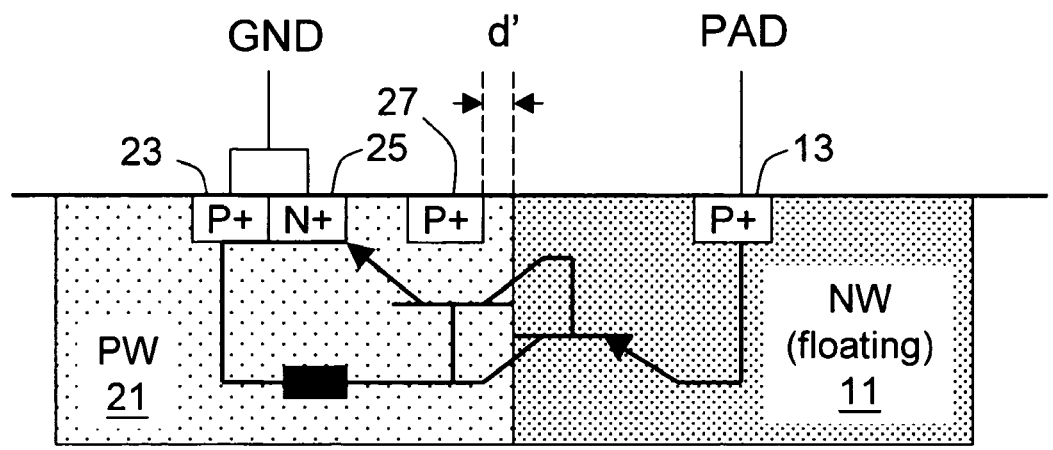

FIG. 6 shows another embodiment of the present invention. In this embodiment, the P+ doped region 27 is not formed at the junction area between N-type well 11 and P-type well 21, but rather at a predetermined distance d' apart from the boundary of the N-type well 11. By adjusting the distance d', the trigger voltage of the ESD device can be adjusted to a range between the embodiments of FIG. 2 and FIG. 4.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. In view of the foregoing, the spirit of the present invention should cover all such and other modifications and variations, which should be interpreted to fall within the scope of the following claims and their equivalents.

What is claimed is:

1. An isolated silicon controlled rectifier (SCR) electrostatic discharge (ESD) device comprising:
   a substrate;
   a first well located in the substrate, which is floating and has a first conductivity type, wherein the first well is not included with a high density doped region having the first conductivity type for connection with the pad;
   a first high density doped region having a second conductivity type for electrical connection with a pad, wherein the first high density doped region is located in the first well;
   a second well nearby the first well and having the second conductivity type;
   a second high density doped region located in the second well and having the second conductivity type;
   a third high density doped region located in the second well and having the first conductivity type,
   wherein the first high density doped region, the first well, the second well, and the third high density doped region constitute an SCR; and
   a fourth high density doped region located at one or more of the following locations:
   (1) at a junction area between the first and second wells,
   (2) in the first well and with a predetermined distance from the junction area between the first and second wells, or
   (3) in the second well and with a predetermined distance from the junction area between the first and second wells.

2. The isolated SCR ESD device of claim 1, wherein when the fourth high density doped region is located at the junction area between the first and second wells, the fourth high density doped region is the first or second conductivity type.

3. The isolated SCR ESD device of claim 1, wherein when the fourth high density doped region is located in the first well and with the predetermined distance from the junction area between the first and second wells, the fourth high density doped region is the first conductivity type.

4. The isolated SCR ESD device of claim 1, wherein when the fourth high density doped region is located in the second well and with the predetermined distance from the junction area between the first and second wells, the fourth high density doped region is the second conductivity type.

5. The isolated SCR ESD device of claim 1, wherein the second and third high density doped regions are coupled to a grounding pad.

6. The isolated SCR ESD device of claim 1, wherein the first conductivity type is N-type and the second conductivity type is P-type.

* * * * *